(12) United States Patent
Chang et al.

(10) Patent No.: US 10,112,826 B2
(45) Date of Patent: Oct. 30, 2018

(54) METHOD FOR FORMING MICRO-ELECTRO-MECHANICAL SYSTEM (MEMS) DEVICE STRUCTURE

(71) Applicant: Taiwan Semiconductor Manufacturing Co., Ltd., Hsinchu (TW)

(72) Inventors: Chih-Hang Chang, Taoyuan (TW); Jen-Hao Liu, Zhunan Township, Miaoli County (TW); I-Shi Wang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 35 days.

(21) Appl. No.: 15/456,271

(22) Filed: Mar. 10, 2017

(65) Prior Publication Data
US 2018/0148327 A1   May 31, 2018

Related U.S. Application Data

(60) Provisional application No. 62/427,415, filed on Nov. 29, 2016.

(51) Int. Cl.
*H04R 23/00* (2006.01)
*B81C 1/00* (2006.01)

(52) U.S. Cl.
CPC .. *B81C 1/00269* (2013.01); *B81C 2201/0132* (2013.01); *B81C 2203/0118* (2013.01); *B81C 2203/0792* (2013.01)

(58) Field of Classification Search
CPC ......... B81C 1/00269; B81C 2203/0118; B81C 2203/035; B81C 1/00301; B81C 1/00984; B81C 2201/013; B81C 2203/0109; B81C 2203/019; B81C 2203/031; B81C 2203/036; B81C 2203/0785; B81C 2203/0792; B81B 2203/0315
USPC .......... 438/51, 113, 52; 257/E21.5, E23.193, 257/418, 685
See application file for complete search history.

(56) References Cited

U.S. PATENT DOCUMENTS

| | | | |
|---|---|---|---|
| 9,527,721 B2 * | 12/2016 | Cheng | B81B 3/0005 |
| 9,634,243 B1 * | 4/2017 | Chuang | H01L 27/228 |
| 2004/0147056 A1 * | 7/2004 | McKinnell | B81B 7/0093 |
| | | | 438/52 |
| 2008/0237823 A1 * | 10/2008 | Martin | B81B 7/0077 |
| | | | 257/685 |
| 2016/0107881 A1 * | 4/2016 | Thompson | B81B 7/0064 |
| | | | 257/418 |

\* cited by examiner

*Primary Examiner* — Edward Chin
(74) *Attorney, Agent, or Firm* — Birch, Stewart, Kolasch & Birch, LLP

(57) ABSTRACT

A method for forming a micro-electro-mechanical system (MEMS) device structure is provided. The method includes forming a recess in a first substrate and forming a dielectric layer on the first substrate and in the recess. The method also includes forming a second substrate on the dielectric layer and etching a portion of the second substrate to form a MEMS structure. The MEMS structure has a plurality of openings. The method further includes etching a portion of the dielectric layer to form a cavity below the openings.

20 Claims, 10 Drawing Sheets

METHOD FOR FORMING MICRO-ELECTRO-MECHANICAL SYSTEM (MEMS) DEVICE STRUCTURE

CROSS REFERENCE TO RELATED APPLICATIONS

This Application claims the benefit of U.S. Provisional Application No. 62/427,415 filed on Nov. 29, 2016, and entitled "Method for forming micro-electro-mechanical system (MEMS) device structure", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Micro-electro mechanical system (MEMS) devices have recently been developed. MEMS devices include devices fabricated using semiconductor technology to form mechanical and electrical features. Examples of the MEMS devices include gears, levers, valves, and hinges. The MEMS devices are implemented in accelerometers, pressure sensors, microphones, actuators, mirrors, heaters, and/or printer nozzles.

Although existing devices and methods for forming the MEMS devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1J' shows a cross-sectional representation of a micro-electro-mechanical system (MEMS) device structure, in accordance with some embodiments of the disclosure.

DETAILED DESCRIPTION

Figure 1A:
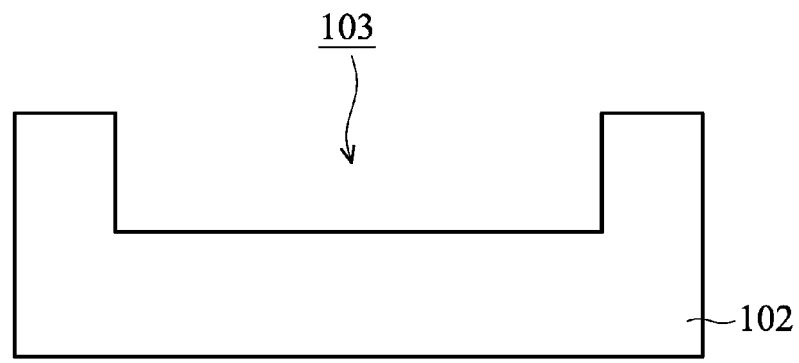
FIGS. 1A-1J show cross-sectional representations of various stages of forming a micro-electro-mechanical system (MEMS) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1J show cross-sectional representations of various stages of forming a micro-electro-mechanical system (MEMS) device structure, in accordance with some embodiments of the disclosure.

As shown in FIG. 1A, a first substrate 102 is provided, in accordance with some embodiments of the disclosure. The first substrate 102 may be made of silicon (Si), silicon-based materials or other semiconductor materials, such as germanium (Ge). In some embodiments, the first substrate 102 is a semiconductor substrate, such as silicon (Si) wafer. In some embodiments, the first substrate 102 is made of a compound semiconductor such as silicon carbide, gallium arsenic, indium arsenide, or indium phosphide. In some embodiments, the first substrate 102 is made of semiconductor material, ceramic material, polymer material, metal material, another applicable material or a combination thereof.

Afterwards, a recess 103 is formed in the substrate 102. The recess 103 is formed by an etching process. In some embodiments, the first substrate 102 is made of silicon, and the recess 103 is formed by a dry etching process. The size of the recess 103 may be adjusted according to actual application.

Figure 1B:
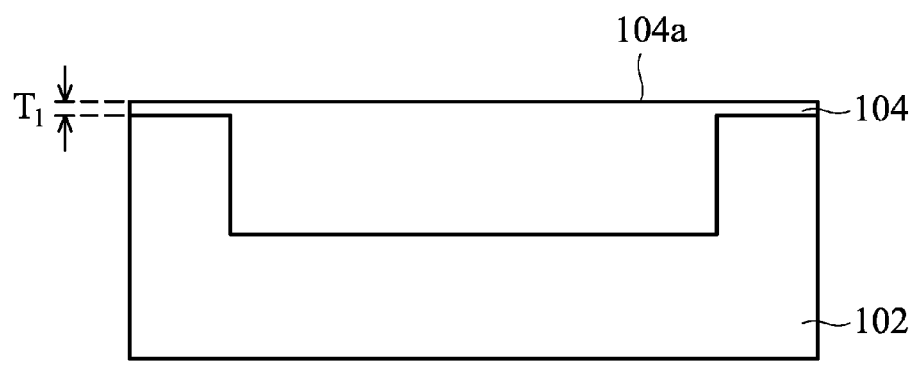

Next, as shown in FIG. 1B, a dielectric layer 104 is formed in the recess 103 and on the first substrate 102, in accordance with some embodiments of the disclosure. A top surface 104a of the dielectric layer 104 is higher than a top surface of the first substrate 102. More specifically, the recess 103 is fully filled with the dielectric layer 104, and no gap or space remains in the dielectric layer 104.

First, the dielectric material is formed in the recess 103 and on the first substrate 102 by a deposition process, and then the dielectric material is thinned by a polishing process. In some embodiments, the deposition process includes a chemical vapor deposition (CVD) process, a spin-on process, an atomic layer deposition (ALD) process, or another applicable process. In some embodiments, a chemical polishing process (CMP) is performed on the dielectric material to form the dielectric layer 104. After the polishing process, the dielectric layer 104 has a flat or planar top surface 104a which is used to assist the bonding of the second substrate 202 (shown in FIG. 1C).

In some embodiments, the dielectric layer 104 is made of an oxide, such as silicon oxide. The dielectric layer 104 has a first thickness $T_1$ measured from a top surface of the first substrate 102 to the top surface of the dielectric layer 104. In some embodiments, the first thickness $T_1$ is in a range from about 1000 nm to about 1200 nm. When the thickness $T_1$ is within above-mentioned range, the fusion bonding process may be performed efficiently.

Figure 1C:
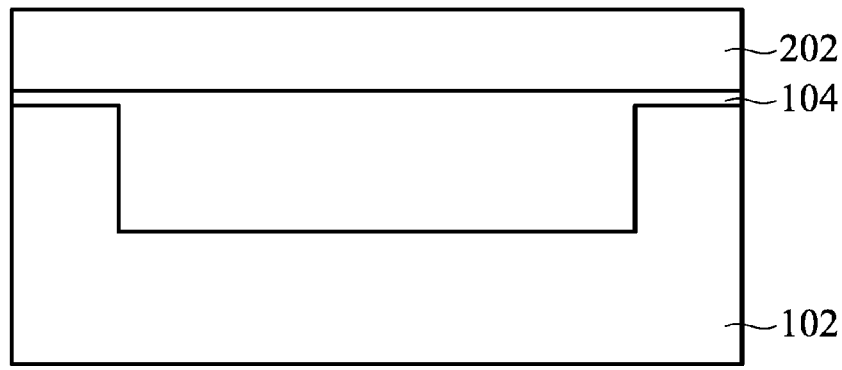

Afterwards, as shown in FIG. 1C, a second substrate 202 is formed on the dielectric layer 104, in accordance with some embodiments of the disclosure. More specifically, the second substrate 202 is formed on the flat or planar top surface 104a.

The material of the second substrate 202 may be the same as the material of the first substrate 102. The second substrate 102 may be made of silicon (Si), silicon-based materials, or other semiconductor materials, such as germanium (Ge). In some embodiments, the second substrate 102 is a semiconductor substrate, such as a silicon (Si) wafer. In some embodiments, the first substrate 102 is made of a compound semiconductor such as silicon carbide, gallium arsenic, indium arsenide, or indium phosphide. The first substrate 102 is a temporary support substrate. In some embodiments, the first substrate 102 is made of semiconductor material, ceramic material, polymer material, metal material, another applicable material, or a combination thereof.

If the recess 103 is not fully filled with the dielectric layer 104, the dielectric layer 104 cannot have a flat or planar top surface. When the second substrate 202 is formed on the dielectric layer 104, the contact area between the second substrate 202 and the dielectric layer 104 is small, and thus bonding strength or bonding quality between the second substrate 202 and the dielectric layer 104 is reduced. The second substrate 202 may easily peel away from the dielectric layer 104 due to the low bonding strength. In order to solve the peeling problem, the dielectric layer 104 has a planar top surface 104a, and therefore the bottom surface of the second substrate 202 can adhere to the flat top surface 104a of the dielectric layer 104. In other words, the flat top surface 104a of the dielectric layer 104 is in direct contact with the second substrate 202 and the planar top surface 104a provides a large contact area to the second substrate 202. Therefore, the bonding strength or bonding quality between the second substrate 202 and the dielectric layer 104 is improved due to the planar top surface 104a of the dielectric layer 104.

A fusion bonding process is performed to bond the second substrate 202 to the first substrate 102 by using the dielectric layer 104 as a bonding interface. In some embodiments, the fusion bonding process may be performed in a pressure in a range from about 0.1 mbar to about 50 mbar. If the pressure is too high, some by-product gas generated from the fusion bonding process may accumulate in the dielectric layer 104. Once more and more by-product gas is formed, the second substrate 202 may be damaged because the by-product gas pushes through the second substrate 202 If the pressure is too low, the difference between the inside and outside of the second substrate 202 may be too great, and the second substrate 202 may deform due to the pressure difference.

Afterwards, an annealing process is performed after the fusion bonding process. The annealing process may facilitate reaction between the silanol group (OH⁻) on the contact interface of the second substrate 202 and the dielectric layer 104. Therefore, a silicon dioxide layer may be formed on the interface of the second substrate 202 and the dielectic layer104, respectively—. The annealing process is performed on the second substrate 202 and the first substrate 102. During the annealing process, if the recess 103 is not fully filled with the dielectric layer 104, some by-product gas may accumulate in the remaining gap in the dielectric layer 104, the second substrate 202 may be deformed and damaged, such as peeling, by the by-product gas outgassing. In order to solve the outgassing problem, the recess 103 is fully filled with the dielectric layer 104. In some embodiments, the annealing process is operated at a temperature in a range from about 200° C. to about 400° C. As a result, a covalent bond, such as $SiO_2$/Si bonding is formed between the second substrate 202 and the dielectric layer 104, and the dielectric layer 104 and the first substrate 102.

Figure 1D:
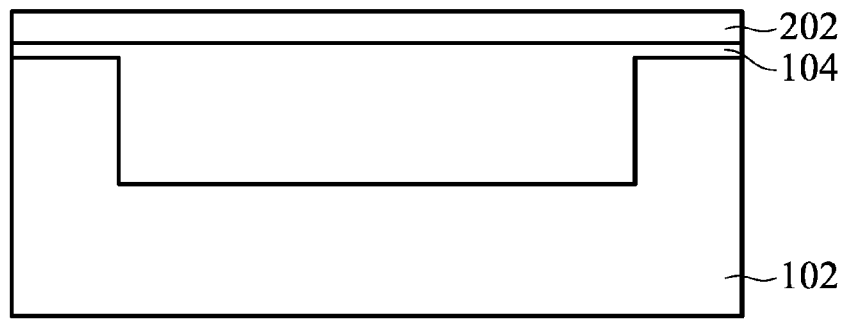

Next, as shown in FIG. 1D, the second substrate 202 is thinned or polished from a backside of the second substrate 202, in accordance with some embodiments of the disclosure. In some embodiments, the second substrate 202 is thinned by a chemical polishing process (CMP).

Figure 1E:
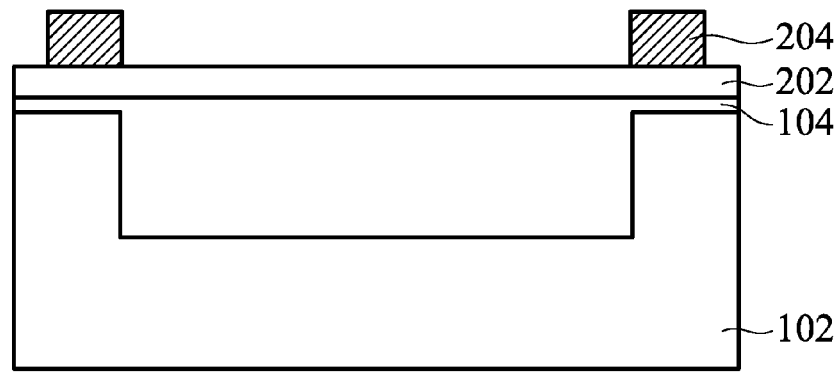

Afterwards, as shown in FIG. 1E, a first bonding layer 204 is formed on the second substrate 202, in accordance with some embodiments of the disclosure. The second substrate 202 may be bonded to another substrate by using the first bonding layer 204 as a bonding material.

The first bonding layer 204 is made of conductive material, such as metal material. In some embodiments, the first bonding layer 204 is made of germanium (Ge), aluminum (Al), copper (Cu), titanium (Ti), tantalum (Ta), silver (Ag), gold (Au), nickel (Ni), indium (In), tin (Sn), or a combination thereof. The first bonding layer 204 is formed by a chemical vapor deposition (CVD) process, a physical vapor deposition (PVD) process, a plating process, or another applicable process.

Figure 1F:
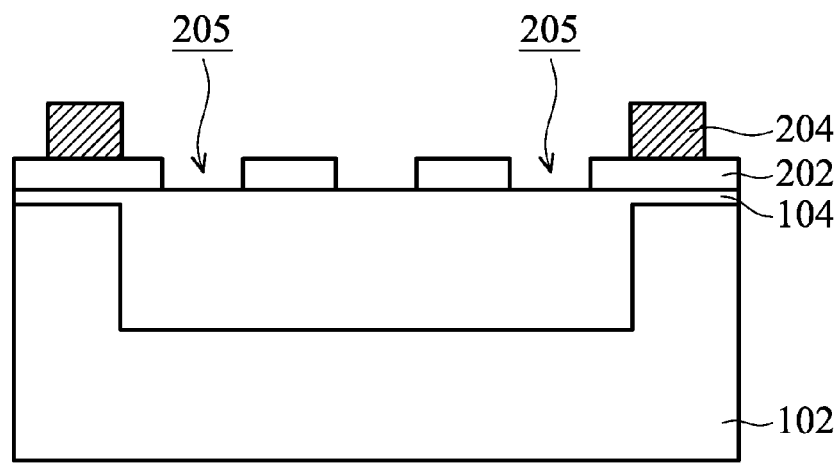

Afterwards, as shown in FIG. 1F, a portion of the second substrate 202 is removed to form a number of openings 205, in accordance with some embodiments of the disclosure. The openings 205 are used to define the position of the moveable elements 202a (shown in FIG. 1G) and provide an entrance for the etching process in FIG. 1G.

In some embodiments, the portion of the second substrate 202 is removed by an etching process, such as a dry etching process or a wet etching process. In some embodiments, the portion of the second substrate 202 is removed by a plasma etching process with argon (Ar) gas when the second substrate 202 is made of silicon (Si). The number of the openings 205 may be adjusted according to actual application.

Figure 1G:
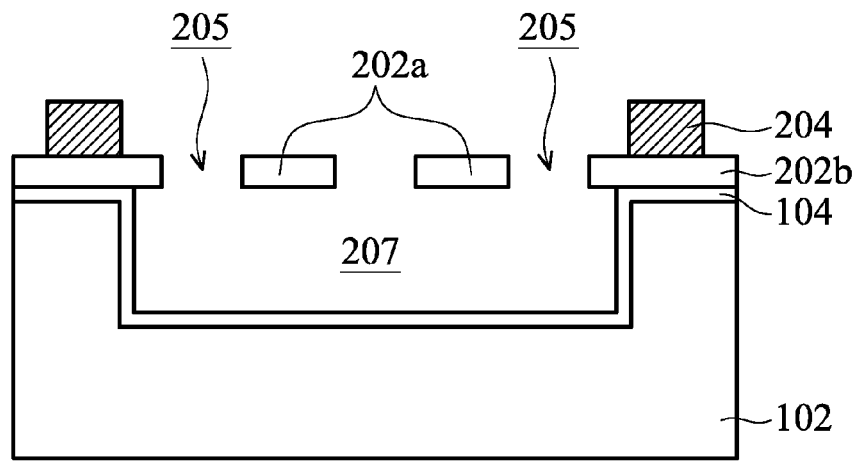

Next, as shown in FIG. 1G, a portion of the dielectric layer 104 below the openings 205 is removed to form a cavity 207, in accordance with some embodiments of the disclosure. As a result, a MEMS substrate with the moveable elements 202a and fixed elements 202b is obtained. The moveable elements 202a are capable of vibrating, bending, deforming or the like. In some embodiments, the moveable elements 202a serve as sensing elements.

The cavity 207 is below the openings 205, and the cavity 207 is surrounded by the first substrate 102. A portion of the dielectric layer 104 is removed, but a portion of the dielectric layer 104 remains on the sidewalls and bottom of the first substrate 102. In other words, the cavity 207 is surrounded by the dielectric layer 104.

In some embodiments, the cavity 207 is formed by a dry etching process, such as a vapor HF etching process. The etching gas of the dry etching process passes through the openings 205 and into the dielectric layer 104 to remove the portion of the dielectric layer 104. The cavity 207 is formed without using a patterning process, and therefore the fabricating time and cost are reduced.

Figure 1H:
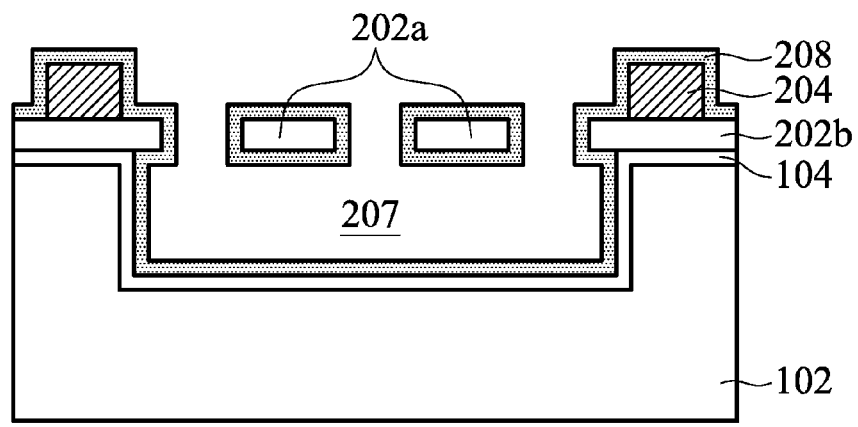

Afterwards, as shown in FIG. 1H, an anti-stiction layer 208 is formed on sidewalls and a bottom surface of the cavity 207, the sidewalls of the openings 205, in accordance with some embodiments of the disclosure. The cavity 207 is surrounded by the anti-stiction layer 208. The moveable elements 202a and the fixed elements 202b are surrounded by the anti-stiction layer 208.

When the movable elements 202a move in the Z directions (+Z direction and −Z direction), the movable elements 202a are prone to sticking to the first substrate 102 due to a stiction force. The stiction issue adversely affects the proper operation of the MEMS device structure. The stiction force includes a capillary force, a molecular van der Waals force and an electrostatic force. In order to prevent the moveable elements 202a, the fixed elements 202b from sticking to each other, the anti-stiction layer 208 is formed to surround the moveable elements 202a and the fixed elements 202b. In addition, the anti-stiction layer 208 is in direct contact with the dielectric layer 104, and therefore the dielectric layer 104 is between the anti-stiction layer 208 and the first substrate 102.

The anti-stiction layer 208 is made of an organic-based material, such as a silicon-based material. In some embodiments, the anti-stiction layer 208 includes one or more self-assembled monolayers (SAMs). The SAMs layer may include silane molecules and alky-chains, or fluorinated alky-chains. For example, the SAMs layer may include FOST ($C_8H_4Cl_3F_{13}Si$), FOMDS ($C_9H_7Cl_2F_{13}Si$), FOMMS ($C_{10}H_{10}ClF_{13}Si$), FOTES ($C_{14}H_{19}F_{13}O_3Si$), FDTS ($C_{10}H_4F_{19}Cl_3Si$), OTS ($C_{18}H_{37}Cl_3Si$), another applicable material, or a combination thereof. The anti-stiction layer 108 is formed by a molecular vapor deposition (MVD) process or another applicable process.

In some embodiments, when the second substrate 202 and the anti-stiction layer 208 are both made of the silicon-based material, the anti-stiction layer 208 interacts with the second substrate 202 to form Si—Si bonds between the anti-stiction layer 208 and the second substrate 202. In addition, the anti-stiction layer 208 interacts with the first bonding layer made of metal material to form Si-metal bonds.

Figure 1I:
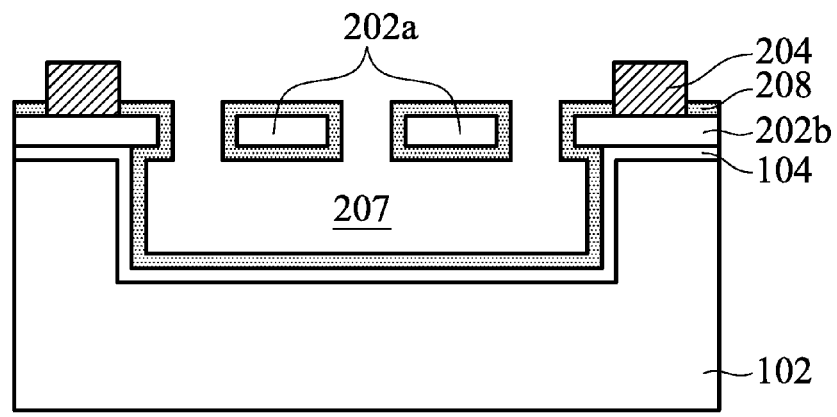

Next, as shown in FIG. 1I, a portion of the anti-stiction layer 208 is removed, in accordance with some embodiments of the disclosure. As a result, a top surface of the first bonding layer 204 and a portion of sidewall of the first bonding layer 204 are exposed. The top surface of the first bonding layer 204 is higher than a top surface of the anti-stiction layer 208.

A portion of the anti-stiction layer 208 is removed by performing an annealing process. The bonding energy between the anti-stiction layer 208 and the dielectric layer 104 is stronger than the bonding energy between anti-stiction layer 208 and the first bonding layer 204. The bonds between the anti-stiction layer 208 and the first bonding layer 204 are broken down by the annealing process. Therefore, the anti-stiction layer 208 on the top surface of the first bonding layer 204 is selectively removed by the annealing process.

In some embodiments, the annealing process is operated at a temperature in a range from about 200° C. to about 400° C. When the temperature of the annealing process is within the above-mentioned range, the bonding between the anti-stiction layer 208 and the first bonding layer 204 is sufficiently broken down.

Figure 1J:
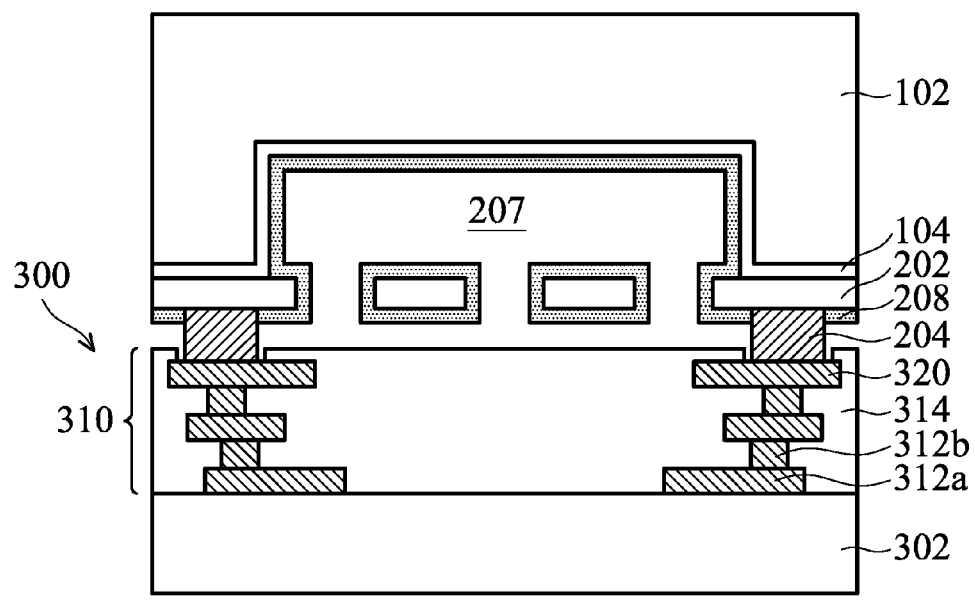
Figure 1J:
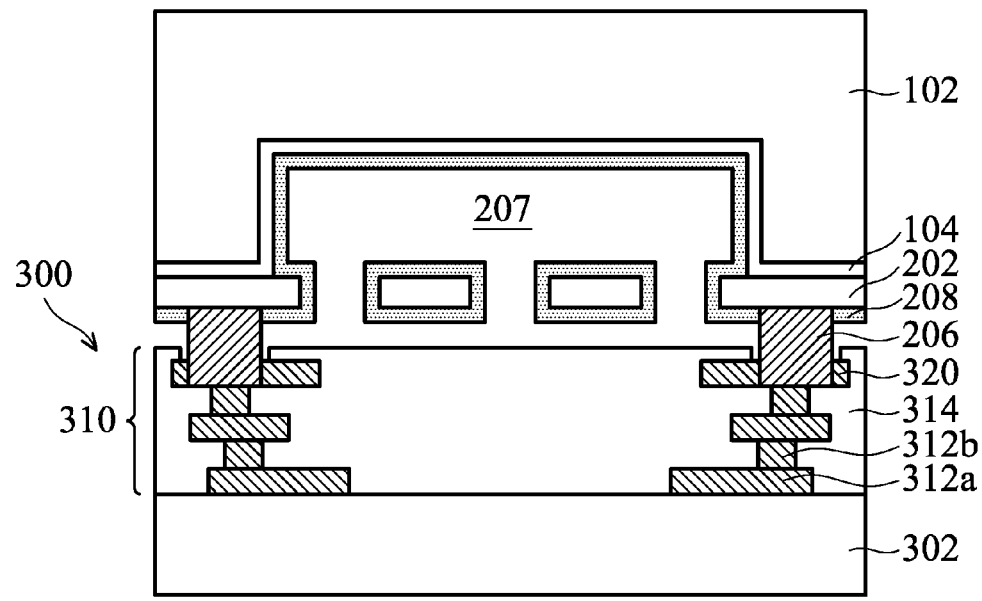

Next, as shown in FIG. 1J, the first substrate 102 is flipped over and disposed on the third structure 300, in accordance with some embodiments of the disclosure. The third structure 300 includes a third substrate 302 and an interconnect structure 310 over the third substrate 302. The first substrate 102 is above the second substrate 202 and the third substrate 302, and is configured as a cap substrate. The second substrate 202 is in a middle position and is configured to as a MEMS substrate.

In some embodiments, the third substrate 302 is a complementary metal-oxide (CMOS) semiconductor substrate or a CMOS wafer. Other device elements may be formed in the third substrate 302. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The interconnect structure 310 includes multiple conductive features formed in a dielectric layer 314. The dielectric layer 314 includes a single layer or multiple dielectric layers. The dielectric layer 314 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 314 is formed by a chemical vapor deposition (CVD) process, a spin-on process, a sputtering process, or a combination thereof.

The conductive features include metal lines 312a and metal vias 312b. A second bonding layer 320 is located at a topmost metal layer. The second bonding layer 320 is made of metal materials, such as germanium (Ge), aluminum (Al), copper (Cu), titanium (Ti), tantalum (Ta), nickel (Ni), silver (Ag), gold (Au), indium (In), tin (Sn) or a combination thereof. In some embodiments, the second bonding layer 320 is formed by plating, electroless plating, sputtering, chemical vapor deposition (CVD) or another applicable process.

The second substrate 202 is bonded to the third substrate 302 by bonding the first bonding layer 304 to the second bonding layer 320. In some embodiments, the bonding process is performed through a eutectic bonding process. The eutectic bonding process is performed with a bonding force at a certain temperature. In some embodiments, the eutectic bonding process is performed at a temperature that depends on the eutectic temperature of the first bonding layer 204 and the second bonding layer 320. In some embodiments, the bonding temperature is higher than the eutectic temperature in a range from about 1-fold to about 1.1-fold. In some embodiments, when the first bonding layer 204 is made of germanium (Ge), the second bonding layer 204 is made of aluminum (Al), and the eutectic bonding process is performed at a temperature in a range from about 420° C. to about 460° C. In some embodiments, the eutectic bonding process is performed at a pressure in a range from about 30 kN to about 60 kN. The eutectic bonding process may be performed in a controlled atmosphere (e.g., in the presence of a forming gas). Examples of forming gases include argon (Ar), nitrogen ($N_2$), hydrogen ($H_2$), helium (He), $N_2/H_2$, or a combination thereof. An alignment process is performed prior to the eutectic bonding process.

FIG. 1J' shows a cross-sectional representation of a micro-electro-mechanical system (MEMS) device structure, in accordance with some embodiments of the disclosure. As shown in FIG. 1J', a eutectic alloy 206 is formed from the first bonding layer 204 and the second bonding layer 320. A portion of the second bonding layer 320 does not react with the first bonding layer 204 and remains to surround the eutectic alloy 206.

Figure 2:
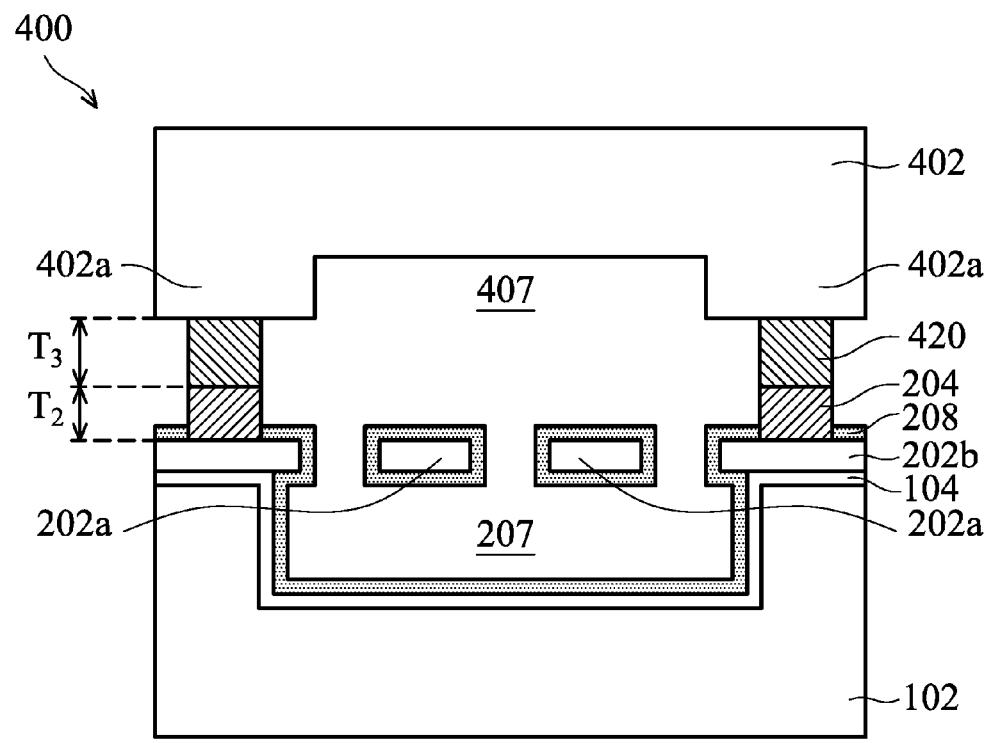
FIG. 2 shows a cross-sectional representation of a micro-electro-mechanical system (MEMS) device structure, in accordance with some embodiments of the disclosure.

FIG. 2 shows a cross-sectional representation of a micro-electro-mechanical system (MEMS) device structure, in accordance with some embodiments of the disclosure. FIG. 2 is formed after the step of FIG. 1I.

As shown in FIG. 2, the fourth structure 400 is formed on the moveable elements 202a and the fixed elements 202b of the second substrate 202, in accordance with some embodiments of the disclosure. The fourth structure 400 includes a fourth substrate 402 and a third bonding layer 420. The fourth substrate 402 is configured as a cap substrate and it is formed above the moveable elements 202a and the fixed elements 202b of the MEMS substrate. The fourth substrate 402 has a recessed portion 407 which is surrounded by an extending portion 402a of the fourth substrate 402. The recessed portion 407 is above the moveable elements 202a, and thus the moveable elements 202a can vibrate between the recessed portion 407 and the cavity 207.

The third bonding layer 420 is formed on extending portion 402a of the fourth substrate 402. The third bonding layer 420 is made of metal materials, such as germanium (Ge), copper (Cu), aluminum (Al), tungsten (W), titanium (Ti), tantalum (Ta), nickel (Ni), silver (Ag), gold (Au), indium (In), tin (Sn) or a combination thereof. In some embodiments, the third bonding layer 420 is formed by plating, electroless plating, sputtering, chemical vapor deposition (CVD) or another applicable process.

The fourth substrate 402 is bonded to the second substrate 202 by bonding the third bonding layer 320 to the first bonding layer 204. In some embodiments, the bonding is performed through a eutectic bonding process. The eutectic bonding process is performed with a bonding force at a certain temperature. In some embodiments, the first bonding layer 204 is made of germanium (Ge), and the third bonding layer 420 is made of aluminum (Al), and a eutectic alloy is formed from the first bonding layer 204 and the third bonding layer 420. The first bonding layer 204 has a second thickness $T_2$, and the third bonding layer 320 has a third thickness $T_3$. In some embodiments, when the first bonding layer 204 is made of germanium (Ge) and the third bonding layer 420 is made of aluminum (Al), a ratio of the third thickness $T_3$ to the second thickness $T_2$ is in a range from about 2/1 to about 3/1.

In this embodiment, the bonding quality between the second substrate 202 to the dielectric layer 104 is improved because the second substrate 202 is adhered to a flat top surface of the dielectric layer 104. In addition, the risk of peeling issue of the second substrate 102 is reduced since the outgassing problems generated from the gap below the second substrate 202 are solved. Furthermore, the cavity 207 is formed by using the openings 205 as entrances without using an extra photolithography process. Therefore, the performance of the micro-electro-mechanical system (MEMS) device structure is improved.

FIGS. 3A-3F show cross-sectional representations of various stages of forming a micro-electro-mechanical system (MEMS) device structure, in accordance with some embodiments of the disclosure. Some processes and materials used to form the micro-electro-mechanical system (MEMS) device structure in FIGS. 3A-3F are similar to those used to form the micro-electro-mechanical system (MEMS) device structure in FIGS. 1A-1J and are not repeated herein.

Figure 3A:
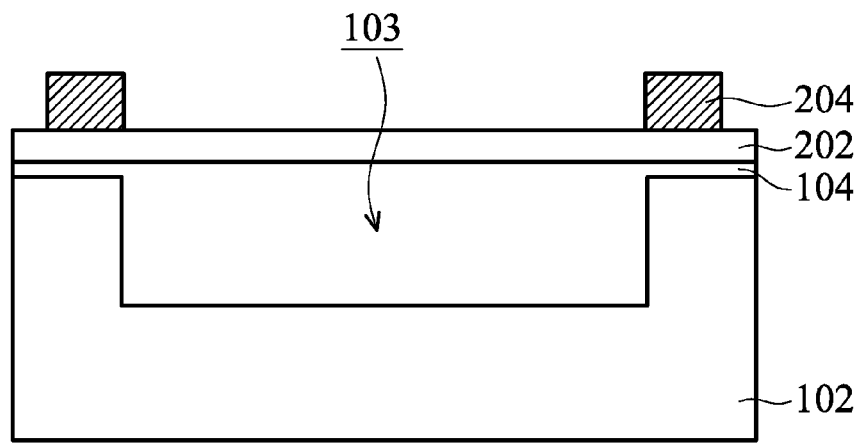
FIGS. 3A-3F show cross-sectional representations of various stages of forming a micro-electro-mechanical system (MEMS) device structure, in accordance with some embodiments of the disclosure.

As shown in FIG. 3A, the recess 103 of the first substrate 102 is filled with the dielectric layer 104, and the dielectric layer 104 has a flat top surface, in accordance with some embodiments of the disclosure. The dielectric material is filled into the recess 103 and on the top surface of the first substrate 102, and then the dielectric material is removed by a polishing process to form the dielectric layer 104.

If the recess 103 is not fully filled with the dielectric layer, and some gaps or spaces remain below the second substrate 202. The bonding strength or bonding quality between the dielectric layer with gaps and the second substrate 202 is weaker than the bonding strength or bonding quality between the dielectric layer 104 with flat top surface and the second substrate 202. The second substrate 202 may easily peel away from the dielectric layer 104 due to the weak bonding strength. In order to prevent the second substrate 202 from peeling, the second substrate 202 is conformally formed on the flat top surface of the dielectric layer 104. Since the dielectric layer 104 has a flat top surface, the second substrate 202 is adhered to the top surface of the dielectric layer 104 tightly by performing a fusion bonding process.

Next, the first bonding layer 204 is formed on the second substrate 202. The first bonding layer 204 is made of conductive material, such as a metal material. In some embodiments, the first bonding layer 204 is made of germanium (Ge), aluminum (Al), copper (Cu), titanium (Ti), tantalum (Ta), silver (Ag), gold (Au), nickel (Ni), indium (In), tin (Sn), or a combination thereof. The first bonding layer 204 is formed by a chemical vapor deposition (CVD) process, a physical vapor deposition (PVD) process, a plating process, or another applicable process.

Figure 3B:
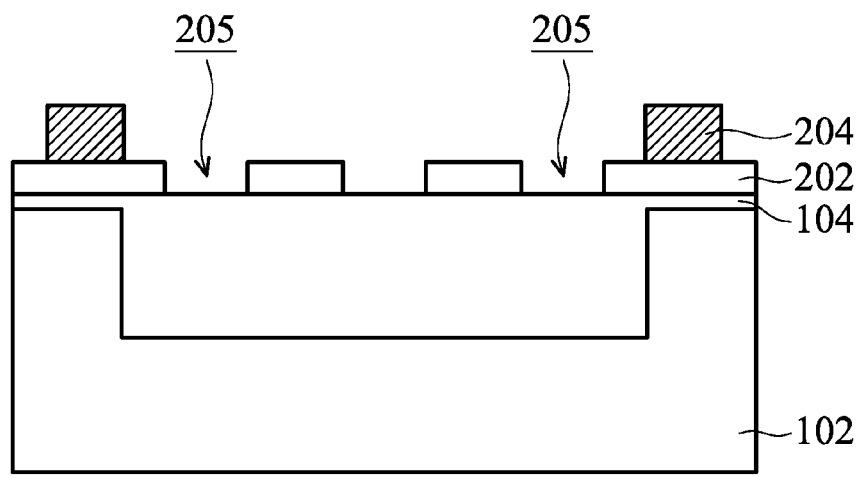

Afterwards, as shown in FIG. 3B, a portion of the second substrate 202 is removed to form a number of openings 205, in accordance with some embodiments of the disclosure. In some embodiments, the portion of the second substrate 202 is removed by an etching process, such as a dry etching process or a wet etching process.

Figure 3C:
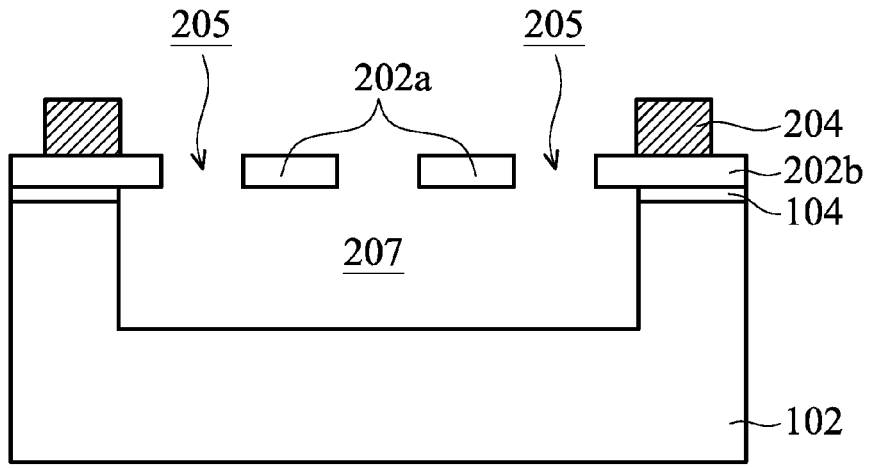

Next, as shown in FIG. 3C, a portion of the dielectric layer 104 is removed, in accordance with some embodiments of the disclosure. As a result, a MEMS substrate with moveable elements 202a and fixed elements 202b is obtained. Furthermore, a cavity 207 is surrounded by the first substrate 102.

The portion of the dielectric layer 104 is removed by using a dry etching process, and the etching gas passes through the openings 205 to the dielectric layer 104. The openings 205 are used as an entrance of the etching gas for etching the dielectric layer 104. The cavity 207 is defined by an etching process without using an extra photolithography process. Therefore, fabrication time and cost are reduced.

The difference between the FIG. 3C and FIG. 1G is that no dielectric layer 104 remains on the sidewall of the first substrate 102 in FIG. 3C. The dielectric layer 104 only remains between the first substrate 102 and flexible elements 202a of the second substrate 202.

Figure 3D:
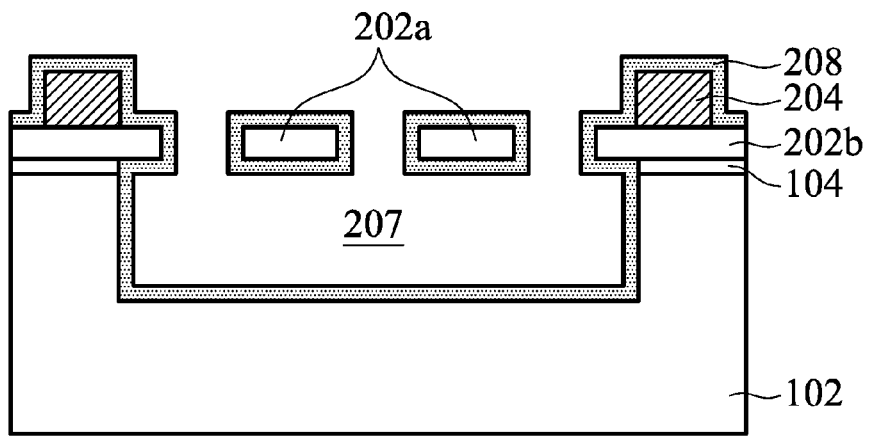
Figure 3E:
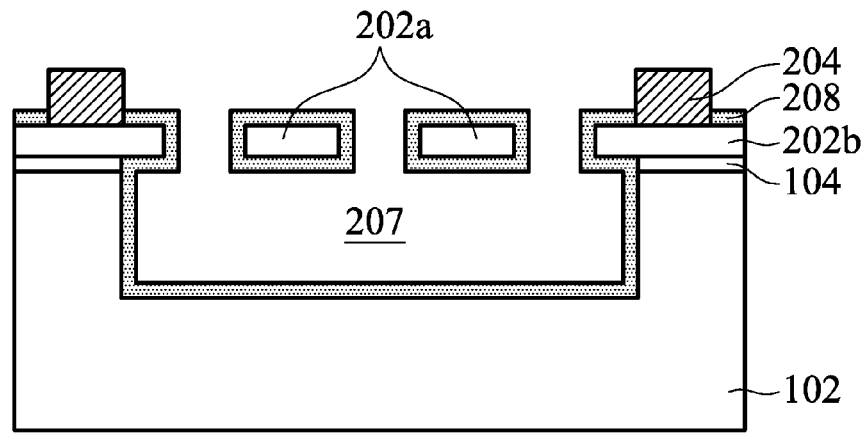

Afterwards, as shown in FIG. 3D, the anti-stiction layer 208 is formed on sidewalls and a bottom surface of the cavity 207, and on the first bonding layer 204, in accordance with some embodiments of the disclosure. Since no dielectric layer 104 remains on the sidewall of the first substrate 102, the anti-stiction layer 208 is in direct contact with the first substrate 102.

Next, a portion of the anti-stiction layer 208 is removed, in accordance with some embodiments of the disclosure. As a result, a top surface of the first bonding layer 204 is exposed. The top surface of the first bonding layer 204 is higher than a top surface of the anti-stiction layer 208.

Figure 3F:
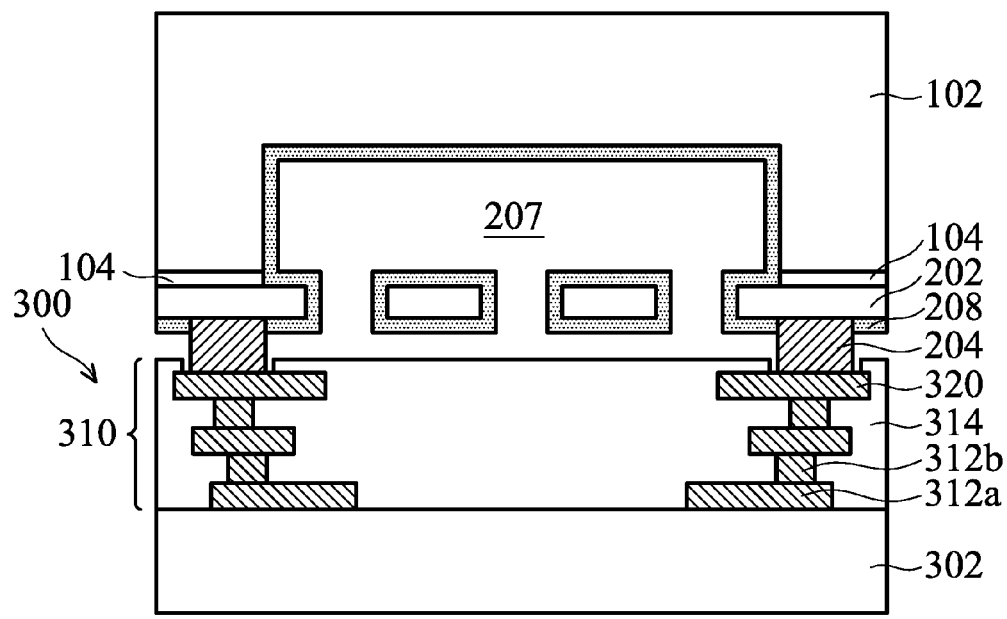

As shown in FIG. 3F, the first substrate 102 is flipped over and disposed on the third structure 300, in accordance with some embodiments of the disclosure. The third structure 300 includes a third substrate 302 and an interconnect structure 310 over the third substrate 302. The interconnect structure 310 is bonded to the second substrate 202 by bonding the second bonding layer 320 and the first bonding layer 204.

Figure 4:
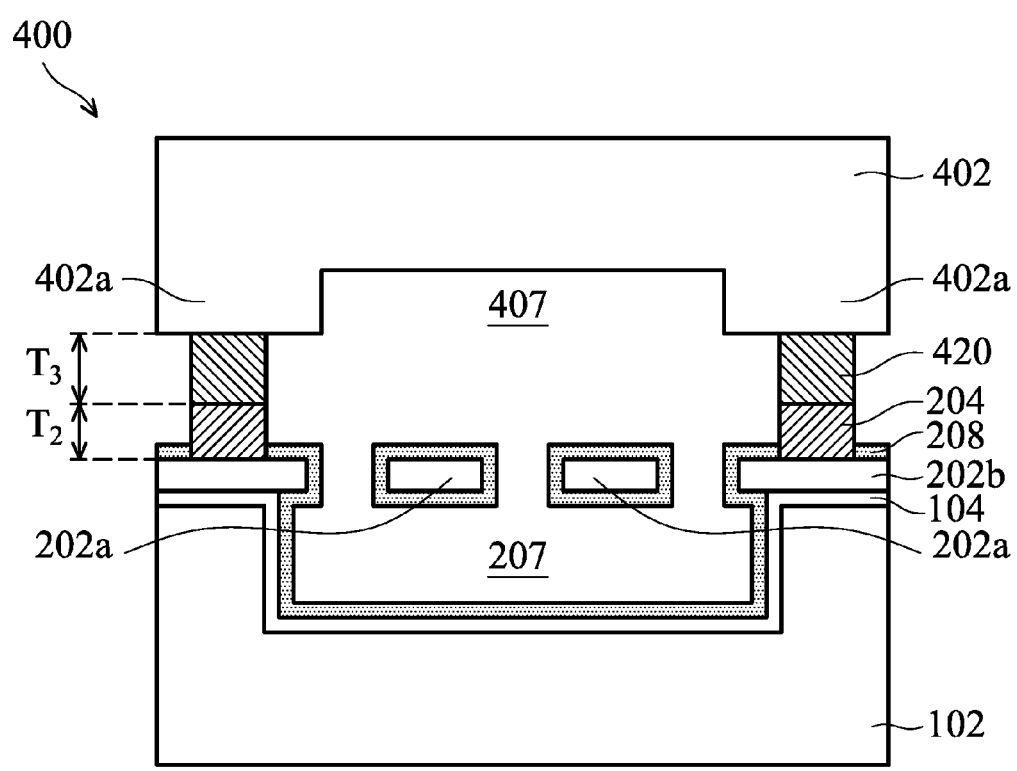
FIG. 4 shows a cross-sectional representation of a micro-electro-mechanical system (MEMS) device structure, in accordance with some embodiments of the disclosure.

FIG. 4 shows a cross-sectional representation of a micro-electro-mechanical system (MEMS) device structure, in accordance with some embodiments of the disclosure. FIG. 4 is formed after the step of FIG. 3E.

As shown in FIG. 4, the fourth structure 400 is formed on the second substrate 202, in accordance with some embodiments of the disclosure. The fourth structure 400 includes the fourth substrate 402 and the third bonding layer 420. The fourth substrate 402 has a recessed portion 407 which is surrounded by an extending portion 402a of the fourth substrate 402.

The second substrate 202 is bonded to the first substrate 102 by using the dielectric layer 104 as a bonding interface. Since the dielectric layer 104 has a flat top surface, the bonding strength between the second substrate 202 and the dielectric layer 104 is improved. The peeling issue due to bad bonding quality between the second substrate 202 and the dielectric layer 104 is solved by the method of the disclosure. In addition, the outgassing problems are solved because no gap or spaces are below the second substrate 202 during the fusion bonding process.

Embodiments for forming a micro-electro-mechanical system (MEMS) device structure are provided. The method includes forming a recess in a first substrate, and a dielectric layer is formed in the recess. The recess is filled with the dielectric layer to provide a flat or planar top surface. A second substrate is conformally formed on the flat top surface of the dielectric layer, and the second substrate is bonded to the first substrate by a fusion bonding process. The bonding quality is improved because the second substrate is bonded to the flat top surface of the dielectric layer. In addition, since no gap or recess remains below the second substrate, the outgassing problems are solved. Afterwards, a portion of the second substrate is removed to form a number of openings, and a portion of the dielectric layer is removed to form a cavity. The portion of the dielectric layer is removed by using the openings as entrances without using an extra photolithography process. Therefore, the fabrication time and cost are reduced, and performance of the micro-electro-mechanical system (MEMS) device structure is improved.

In some embodiments, a method forming a micro-electro-mechanical system (MEMS) device structure is provided. The method includes forming a recess in a first substrate and forming a dielectric layer on the first substrate and in the recess. The method also includes forming a second substrate on the dielectric layer and etching a portion of the second substrate to form a MEMS structure. The MEMS structure has a plurality of openings. The method further includes etching a portion of the dielectric layer to form a cavity below the openings.

In some embodiments, a method forming a micro-electro-mechanical system (MEMS) device structure is provided. The method includes forming a recess in a first wafer and depositing a dielectric layer in the recess and on the first wafer. The method also includes thinning the dielectric layer and bonding a second wafer on the dielectric layer by a fusion bonding process. The method further includes forming a first bonding layer on the second wafer and forming a plurality of openings in the second wafer to form a MEMS structure with a plurality of movable elements.

In some embodiments, a method forming a micro-electro-mechanical system (MEMS) device structure is provided. The method includes forming a recess in a first substrate and forming a dielectric layer on the first substrate and in the recess. The recess is fully filled with the dielectric layer. The method also includes bonding a second substrate to the first substrate through the dielectric layer and forming a first bonding layer on the second substrate. The method further includes etching a portion of the second substrate to form a plurality of openings and etching a portion of the dielectric layer to form a cavity below the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a micro-electro-mechanical system (MEMS) device structure, comprising: forming a recess in a first substrate; depositing a dielectric layer on the first substrate and filling the recess, wherein an entirety of the dielectric layer has a substantially planar top surface; bonding a second substrate on the dielectric layer, wherein an entire bottom surface of the second substrate is in direct contact with the substantially planar top surface of the dielectric layer; etching a portion of the second substrate to form a MEMS structure, wherein the MEMS structure has a plurality of openings; and etching a portion of the dielectric layer to form a cavity below the openings.

2. The method for forming the micro-electro-mechanical system (MEMS) device structure as claimed in claim 1, wherein forming the second substrate on the dielectric layer comprises:
bonding the second substrate on the dielectric layer by performing a fusion bonding process, and the fusion bonding process is performed in a pressure in a range from about 0.1 mbar to about 50 mbar.

3. The method for forming the micro-electro-mechanical system (MEMS) device structure as claimed in claim 1, further comprising:
thinning the dielectric layer until the dielectric layer has the substantially planar top surface before bonding the second substrate on the dielectric layer.

4. The method for forming the micro-electro-mechanical system (MEMS) device structure as claimed in claim 1, further comprising:
thinning the second substrate from a backside of the second substrate before etching the portion of the second substrate, wherein the backside of the second substrate is far away from the dielectric layer.

5. The method for forming the micro-electro-mechanical system (MEMS) device structure as claimed in claim 1, further comprising:
   forming a first bonding layer on the second substrate.

6. The method for forming the micro-electro-mechanical system (MEMS) device structure as claimed in claim 5, further comprising:
   forming an interconnect structure over a third substrate;
   forming the third substrate on the second substrate by bonding the first bonding layer to the interconnect structure.

7. The method for forming the micro-electro-mechanical system (MEMS) device structure as claimed in claim 5, further comprising:
   forming a third substrate on the second substrate, wherein the third substrate comprises a second bonding layer,
   bonding the third substrate to the second substrate by bonding the first bonding layer to the second bonding layer.

8. The method for forming the micro-electro-mechanical system (MEMS) device structure as claimed in claim 7, wherein the first bonding layer is made of a first metal layer, and the second bonding layer is made of a second metal layer, and a eutectic bond is formed between the third substrate and the second substrate.

9. The method for forming the micro-electro-mechanical system (MEMS) device structure as claimed in claim 1, further comprising:
   forming an anti-stiction layer on sidewalls and a bottom surface of the cavity, and in sidewalls of the openings.

10. The method for forming the micro-electro-mechanical system (MEMS) device structure as claimed in claim 9, further comprising:
    performing an annealing process on the anti-stiction layer to remove a portion of the anti-stiction layer.

11. The method for forming the micro-electro-mechanical system (MEMS) device structure as claimed in claim 9, wherein a portion of the anti-stiction layer is in direct contact with the first substrate.

12. A method for forming a micro-electro-mechanical system (MEMS) device structure, comprising:
    forming a recess in a first wafer;
    depositing a dielectric layer in the recess and on the first wafer;
    thinning the dielectric layer, wherein an entirely of the dielectric layer has a substantially planar top surface after the step of thinning the dielectric layer;
    bonding a second wafer on the dielectric layer by a fusion bonding process, wherein an entire bottom surface of the second wafer is in direct contact with the substantially planar top surface of the dielectric layer;
    forming a first bonding layer on the second wafer; and
    forming a plurality of openings in the second wafer to form a MEMS structure with a plurality of movable elements.

13. The method for forming the micro-electro-mechanical system (MEMS) device structure as claimed in claim 11, further comprising:
    etching a portion of the dielectric layer through the openings to form a cavity, wherein the cavity is surrounded by the first wafer.

14. The method for forming the micro-electro-mechanical system (MEMS) device structure as claimed in claim 13, further comprising:
    forming an anti-stiction layer in sidewalls and a bottom surface of the cavity, in sidewalls of the openings, and on the first bonding layer.

15. The method for forming the micro-electro-mechanical system (MEMS) device structure as claimed in claim 11, further comprising:
    forming a third wafer on the second wafer, wherein the third wafer has a second bonding layer;
    bonding the third wafer to the second wafer by bonding the first bonding layer and the second bonding layer.

16. The method for forming the micro-electro-mechanical system (MEMS) device structure as claimed in claim 11, wherein thinning the dielectric layer comprises performing a polishing process on the dielectric layer until the dielectric layer has the substantially planar top surface.

17. A method for forming the micro-electro-mechanical system (MEMS) device structure, comprising:
    forming a recess in a first substrate;
    forming a dielectric layer on the first substrate and in the recess, wherein the recess is fully filled with the dielectric layer, and an entirety of the dielectric layer has a substantially planar top surface;
    bonding a second substrate to the first substrate through the dielectric layer, wherein an entire bottom surface of the second substrate is in direct contact with the substantially planar top surface of the dielectric layer;
    forming a first bonding layer on the second substrate;
    etching a portion of the second substrate to form a plurality of openings; and
    etching a portion of the dielectric layer to form a cavity below the openings.

18. The method for forming the micro-electro-mechanical system (MEMS) device structure as claimed in claim 17, wherein bonding a second substrate to the first substrate through the dielectric layer comprises performing a fusion bonding process on the second substrate and the first substrate by using the dielectric layer as a bonding interface.

19. The method for forming the micro-electro-mechanical system (MEMS) device structure as claimed in claim 17, further comprising:
    forming an anti-stiction layer in sidewalls and a bottom surface of the cavity, in sidewalls of the openings, and on the first bonding layer.

20. The method for forming the micro-electro-mechanical system (MEMS) device structure as claimed in claim 17, further comprising:
    forming a third substrate on the second substrate, wherein the third substrate comprises a second bonding layer,
    bonding the third substrate to the second substrate by bonding the first bonding layer to the second bonding layer.

* * * * *